(12) United States Patent
Yeh et al.

(10) Patent No.: US 7,011,145 B2
(45) Date of Patent: Mar. 14, 2006

(54) METHOD FOR ENHANCING MOBILITY OF WORKING FLUID IN LIQUID/GAS PHASE HEAT DISSIPATING DEVICE

(75) Inventors: Lan-Kai Yeh, Kaohsiung (TW);
Che-Wei Lin, Hsinchu (TW);
Shao-Wen Chen, Taichung (TW);
Jin-Cherng Shyu, Pingtung (TW);
Ming-Jye Tsai, Hsinchu (TW)

(73) Assignee: Industrial Technology Research Institute, Hsinchu (TW)

(*) Notice: Subject to any disclaimer, the term of this patent is extended or adjusted under 35 U.S.C. 154(b) by 0 days.

(21) Appl. No.: 10/887,879

(22) Filed: Jul. 12, 2004

(65) Prior Publication Data

US 2006/0005951 A1    Jan. 12, 2006

(51) Int. Cl.
*F28D 15/00* (2006.01)
(52) U.S. Cl. .............. 165/104.21; 165/104.26; 29/890.032
(58) Field of Classification Search ........... 165/104.26, 165/104.21, 104.33, 185, 80.4; 361/700; 174/15.2; 257/715, 716
See application file for complete search history.

(56) References Cited

U.S. PATENT DOCUMENTS

| | | | | |
|---|---|---|---|---|
| 3,576,210 A | * | 4/1971 | Trent | 165/104.26 |
| 3,840,069 A | * | 10/1974 | Fischer et al. | 165/104.26 |
| 4,043,387 A | * | 8/1977 | Lamp | 165/104.27 |
| 4,186,796 A | * | 2/1980 | Usui | 165/104.26 |
| 4,733,699 A | * | 3/1988 | Hata | 138/145 |
| 4,879,185 A | * | 11/1989 | Masuda et al. | 428/687 |
| 5,242,644 A | * | 9/1993 | Thompson et al. | 264/177.15 |
| 6,132,823 A | * | 10/2000 | Qu | 428/34.6 |
| 6,158,502 A | | 12/2000 | Thomas | |
| 6,167,948 B1 | | 1/2001 | Thomas | |
| 6,427,765 B1 | * | 8/2002 | Han et al. | 165/104.26 |
| 6,446,706 B1 | * | 9/2002 | Rosenfeld et al. | 165/46 |
| 2004/0040696 A1 | * | 3/2004 | Cho et al. | 165/104.26 |

FOREIGN PATENT DOCUMENTS

| | | | | |
|---|---|---|---|---|
| JP | 8-200976 | * | 8/1996 | 165/104.26 |
| JP | 2001-336890 | * | 12/2001 | 165/104.26 |
| JP | 2002-62070 | * | 2/2002 | 165/104.26 |
| TW | 501722 | | 9/2002 | |
| TW | 528151 | | 4/2003 | |
| TW | 563016 | | 11/2003 | |

\* cited by examiner

*Primary Examiner*—Terrell McKinnon
(74) *Attorney, Agent, or Firm*—Birch, Stewart, Kolasch & Birch, LLP

(57) ABSTRACT

A method for enhancing the mobility of a working fluid in a liquid/gas phase heat dissipating device improves the mobility of the working fluid therein, and further enhancing the heat dissipation capability of the heat dissipating device. The present invention coats a layer on the surface of a capillary structure inside the heat dissipating device to increase the material property on the surface and the coupling force between the working fluid and the capillary structure and decrease the contact angle between the working fluid and the capillary structure, and thus the working fluid has a higher mobility to solve the problem of the high heat flux density of the liquid/gas heat dissipating device and improve the heat dissipation effect. The present invention not only applies to the heat generating electronic components within a limited space, but also applies to other electronic components that require a constant temperature.

9 Claims, 6 Drawing Sheets

METHOD FOR ENHANCING MOBILITY OF WORKING FLUID IN LIQUID/GAS PHASE HEAT DISSIPATING DEVICE

FIELD OF THE INVENTION

The present invention relates to a method for manufacturing a fluid phase heat dissipating device, more particularly to a method of enhancing the mobility of a working fluid in a liquid/gas phase heat dissipating device.

BACKGROUND OF THE INVENTION

With the requirements of high performance and high efficiency, the operating frequency of electronic components is getting larger and larger. As a result, the quantity of heat so produced is increasing day after day. However, the advancement of science and technology makes electronic products to follow the trend of a light, thin, short and compact design. The reduced size also increases the quantity of electronic components per unit volume, and thus results in a trend of giving out heat in a high thermal flux density. Since the operating temperature of an electronic component is closely related to the reliability and the life of the electronic component, therefore the way of effectively enhancing the heat dissipating capability becomes a key issue, particularly in the field of electronic peripherals of notebook computers that is restricted by volume and size.

Since the design and performance of different electronic components are different, the heat flux is unevenly distributed at different positions of an electronic product and the so-called hot spots will be produced on the surface due to different local temperatures. To solve the problem, manufacturers develop an even heat dissipating device with a capillary structure to overcome the foregoing shortcomings. A heat pipe is an example of such applications, and the principle of its actions resides on injecting a volatile working fluid such as water or alcohol into a sealed container or forming a low pressure in such sealed container and having a capillary structure therein. The working fluid is converted into gas phase after absorbing heat from the heated side, and the gas-phase working fluid is condensed into liquid phase under a lower temperature. The heat is discharged by the high latent heat effect of the gas/liquid phase conversion process, and then flows back to the heated side through the capillary structure, and thus constituting a circular heat dissipation operation.

Please refer to FIG. 1 for the cross-sectional view of a prior art liquid/gas phase heat dissipating device, which is a sealed metal cavity 10 having a capillary structure layer 11, a heated end (vaporizing end) 12, and a cooling end (condensing end) 13. The sealed metal cavity 10 contains a working fluid, and the working fluid is a liquid selected from pure water, ammonia solution, methyl alcohol, ethyl alcohol and acetone which has a high mobility and absorbs large quantity of heat when evaporated.

The principle of heat dissipation is to use the working fluid to transfer the heat produced by the electronic components as indicated by the arrows in FIG. 1 from the heated end 12 to the cooling end 13, and the capillary structure layer 11 of the sealed metal cavity 10 is used to proceed with the cycle of evaporation and condensation.

Although the capillary structure of the present even heat dissipation device provides the mobility for the liquid, yet the tension of the capillary is related to the contact surface and the material performance. As to water, a better hydrophilic surface has a smaller contact angle and a better mobility, and thus provides better performance for the capillary tension and the backflow of the liquid.

As to the general liquid/gas phase heat dissipating device and water is taken, as an example of the working fluid, since the material adopted by the device needs to have a better thermal conductive coefficient for a better heat dissipation effect. At present, the metal including copper or aluminum having a better thermal conductive is used for the basic material, but copper will react with the oxygen in the air to produce copper oxide and aluminum will react with oxygen to produce aluminum oxide. As a result, the contact angle between the inner wall of the capillary structure and water is too large, and thus the mobility of water is lowered and the heat dissipation effect is reduced. If other methods are used to enhance the capillary tension such as changing the size of the capillary structure or eliminating the impurities on the surface, the cost for the manufacturing technology and expenditure required for such change will be increased. Even after the size of the capillary structure is accomplished, the contact angle between the surface of the capillary structure becomes smaller, but the property of the basic material of the surface of the capillary structure is still not improved, and thus the mobility of the working fluid has not been improved thoroughly.

If copper is used as the material for manufacturing the even heat dissipating device containing a working fluid, the manufacturing procedure includes rinsing the copper pipe first to reduce the contamination of impurities and assuring its performance. However, the general rinsing procedure takes lots of manpower, and if related chemical rinsing agents such as a pickling or an organic solvent are used for the rinse, such arrangement not only increases the cost, but also contaminates the environment. Most importantly, the oxidation capability after the rinse is not good. Once the copper pipe is oxidized, then the mobility of the working fluid will be further lowered.

The prior-art heat dissipation devices having a capillary structure as disclosed in the U.S. Pat. No. 6,158,502 published on Dec. 12, 2000 and the U.S. Pat. No. 6,167,948 published on Jan. 2, 2001 come with a diversification design of the capillary structure. Besides the size and arrangement of the capillary structure, there is no significant improvement on the property of the surface of the capillary structure. Other heat dissipating devices having a capillary structure have been disclosed in many R.O.C. patent applications such as the R.O.C. patent application Publication No. 563,016 published on Nov. 21, 2003 which disclosed a method of manufacturing a heat pipe, the R.O.C. patent application Publication No. 528,151 published on Apr. 11, 2003 which disclosed a heat dissipating device adopting a two-layer capillary structure instead of a single-layer capillary structure, and the R.O.C. patent application Publication No. 501,722 published on Sep. 1, 2002 which disclosed a heat dissipating device using a different form of copper grids to produce the capillary structure. However, the foregoing prior arts did not teach how to improve the surface contact of the working fluid and the capillary structure.

SUMMARY OF THE INVENTION

The primary objective of the present invention is to improve the mobility of the working fluid in a liquid/gas phase heat dissipating device and further enhance the heat dissipation capability of the heat dissipating device.

To achieve the foregoing objective, the present invention utilizes the method of changing the property of the surface of a liquid/gas phase heat dissipating device to coat a layer of material on the surface of the capillary structure, and the coating method could be by sputtering, plating, electroplating, electronform or chemical vapor disposition (CVD) and the coating material could be any one selected from copper, iron, zinc, aluminum, nickel, and chromium, so that the contact angle between the working fluid and the capillary structure according to the present invention is smaller than that of the prior-art device, and thus the working fluid has a better adhesion with the capillary structure in the sealed cavity as well as a better mobility for the fluid, and further gives a better heat dissipation effect.

The detailed description and technical characteristics of the present invention are described together with the drawings as follows.

DETAILED DESCRIPTION OF THE PREFERRED EMBODIMENTS

Figure 1:
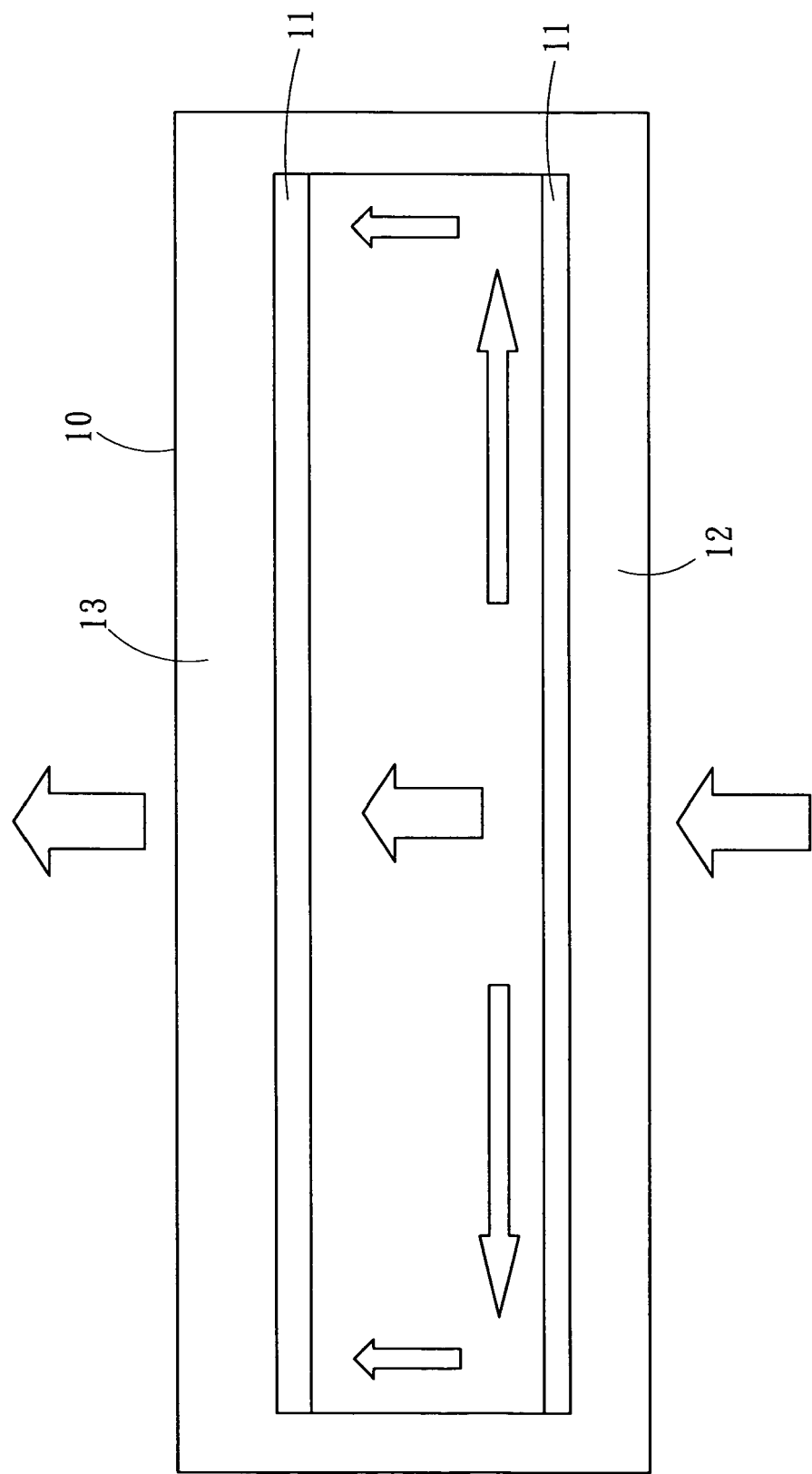
FIG. 1 is a cross-sectional view of a prior-art liquid/gas phase heat dissipating device.
Figure 2:
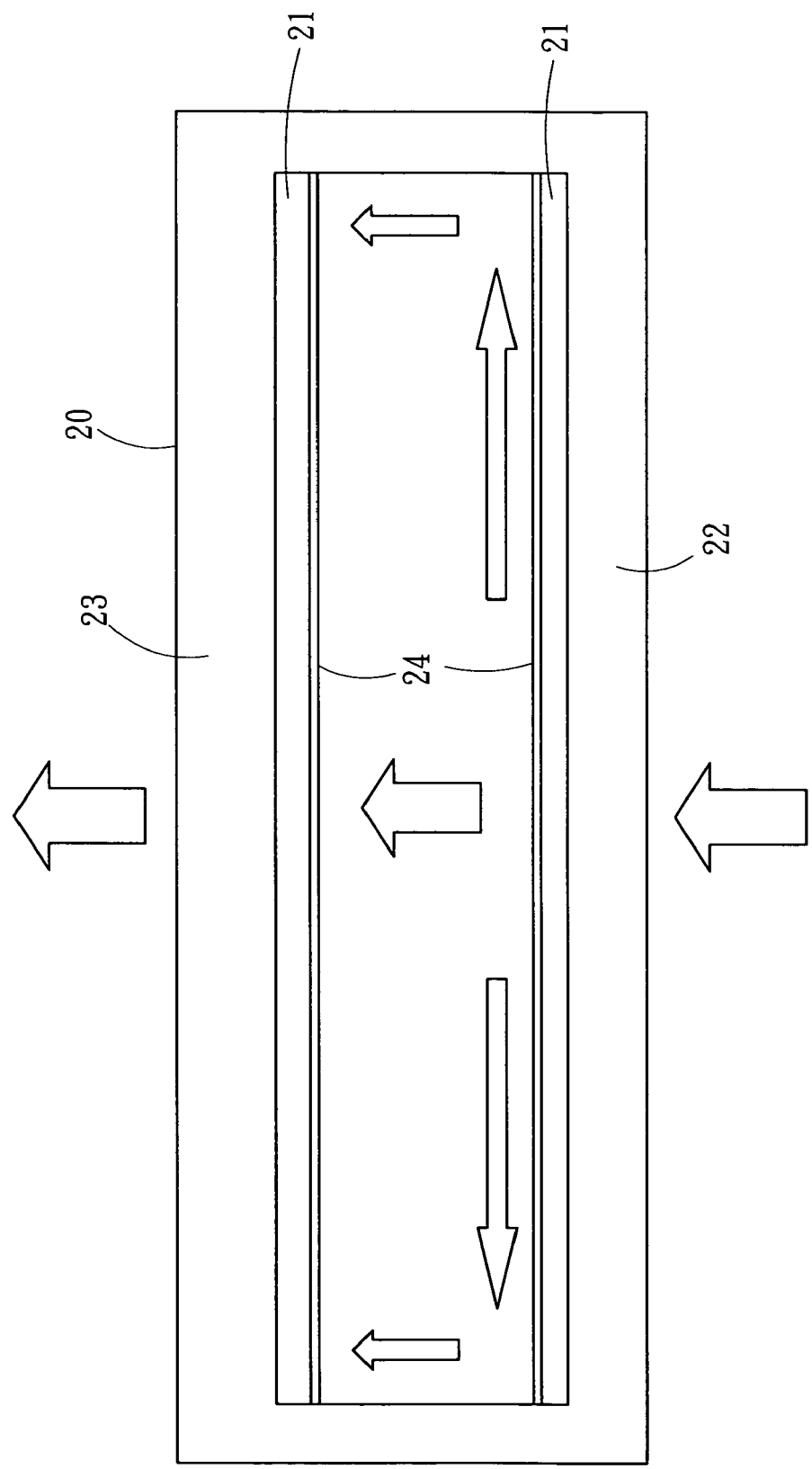
FIG. 2 is a cross-sectional view of a liquid/gas phase heat dissipating device of the present invention.

Please refer to FIG. 2 for the cross-sectional view of the liquid/gas phase heat dissipating device according to the present invention. The heat dissipating device is a sealed metal cavity 20 containing a capillary structure layer 21, and a hydrophilic layer 24 coated on the surface of the capillary structure layer 21 and the coating methods include but not limited to sputtering, plating, electroplating, electronform, and chemical vapor deposition (CVD), etc. The hydrophilic layer 24 is made of any one of the materials selected from iron, zinc, aluminum, nickel and chromium. The sealed metal cavity 20 has a heated end (vaporizing end) 22 and a cooling end (condensing end) 23. The sealed metal cavity 20 contains a working fluid, and the working fluid could be a fluid selected from pure water, ammonia solution, methyl alcohol, ethyl alcohol and acetone which has a high mobility and absorbs a large quantity of heat during the evaporation.

Figure 3:
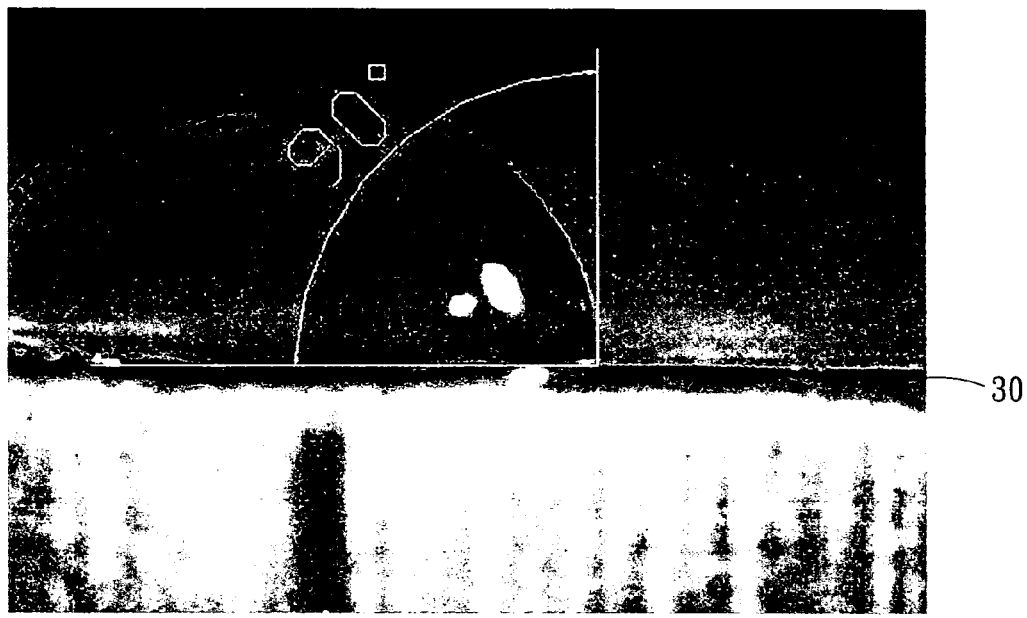
FIG. 3 is a view of the contact angle between water and a capillary structure layer of a prior-art liquid/gas phase heat dissipating device before the surface of the capillary structure layer is rinsed.
Figure 4:
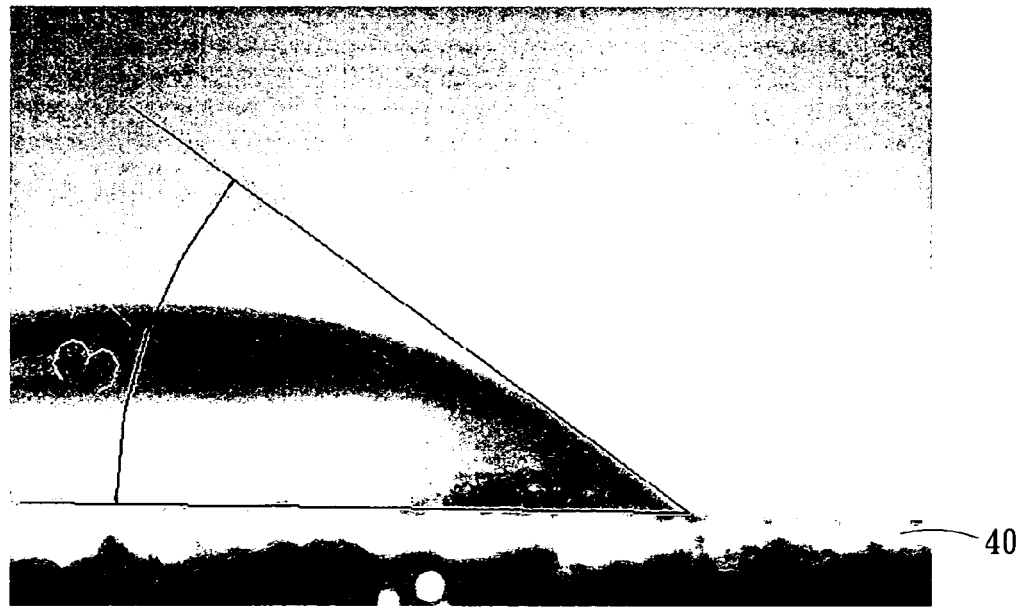
FIG. 4 is a view of the contact angle between water and a capillary structure layer of a prior-art liquid/gas phase heat dissipating device after the surface of the capillary structure layer is rinsed.

The principle of heat dissipation is to use the working fluid to transfer the heat produced by the electronic components as indicated by the arrows in FIG. 2 from the heated end 22 to the cooling end 23, and the capillary structure layer 21 of the sealed metal cavity 20 is used to proceed with the cycle of evaporation and condensation, The general liquid/gas phase heat dissipating device uses copper as the basic material and water as the working fluid. If the surface of the capillary structure layer 11 is not rinsed, then the contact angle between water and the capillary structure layer 11 as shown in FIG. 3 is almost 90 degrees. After the surface of the capillary structure layer 11 is rinsed, then the contact angle as shown in FIG. 4 is reduced to approximately 37 degrees.

Figure 5:
FIG. 5 is a view of the contact angle between water and a capillary structure layer according to the present invention after coating a layer of nickel on the surface of the capillary structure layer.

The method according to the present invention as shown in FIG. 5 coats a layer of nickel on the surface 50 with a thickness between 5 nm to 10 μm of the capillary structure layer 21. The contact angle between water and the hydrophilic layer 24 is only about 27 degrees after coating the surface. Compared with the contact angle between water and the capillary structure layer 11 according to the prior arts as shown in FIGS. 3 and 4, the present invention has the smallest contact angle among the three. After the contact angle is reduced, the mobility of water is increased and the capillary tension is improved, so that the water can carry away more heat and thus improving the heat dissipation performance.

Figure 6:
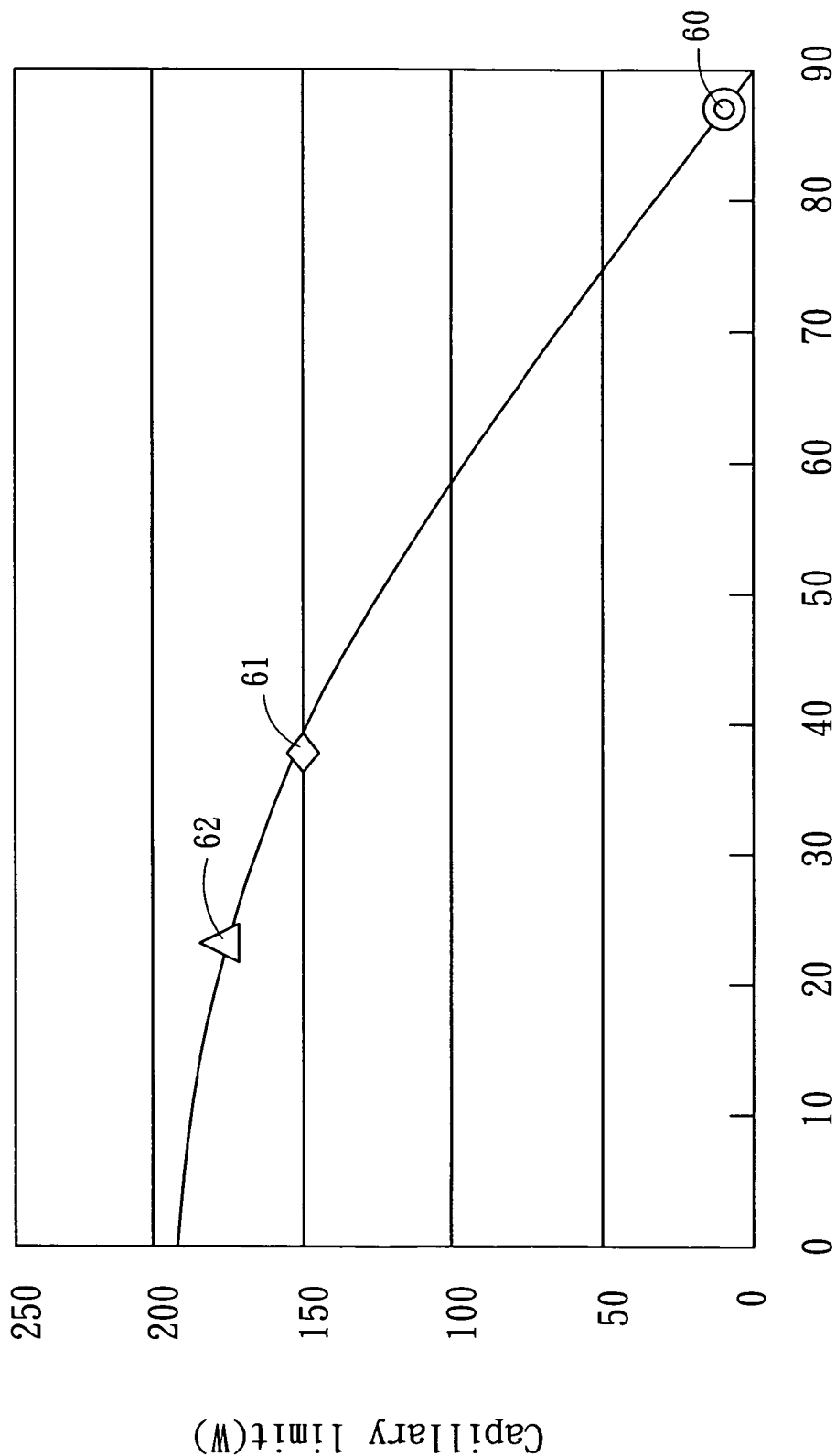
FIG. 6 is the curve of the contact angle of the working fluid versus the heat dissipation performance.

Please refer to FIG. 6 again for the curve of the contact angle of the working fluid versus the heat dissipation performance. This embodiment adopts nickel as the hydrophilic layer 24 and water as the working fluid. If the heat dissipating device is made of copper and the surface of the capillary structure layer 11 is not rinsed, the heat dissipation performance is the poorest and the contact angle with water is the largest at the corresponding point 60 as shown in the figure.

After the surface of the capillary structure layer 11 is rinsed, the contact angle with water is decreased and the heat dissipation performance is improved at the point 61 as shown in the figure. After the design of the invention is adopted and a thin layer of nickel is coated onto the surface of the capillary structure layer 21 of the copper plate, the contact angle between water and capillary structure layer 21 is the smallest among the three and the heat dissipation performance is the best at the point 62 as shown in the figure.

Figure 7:
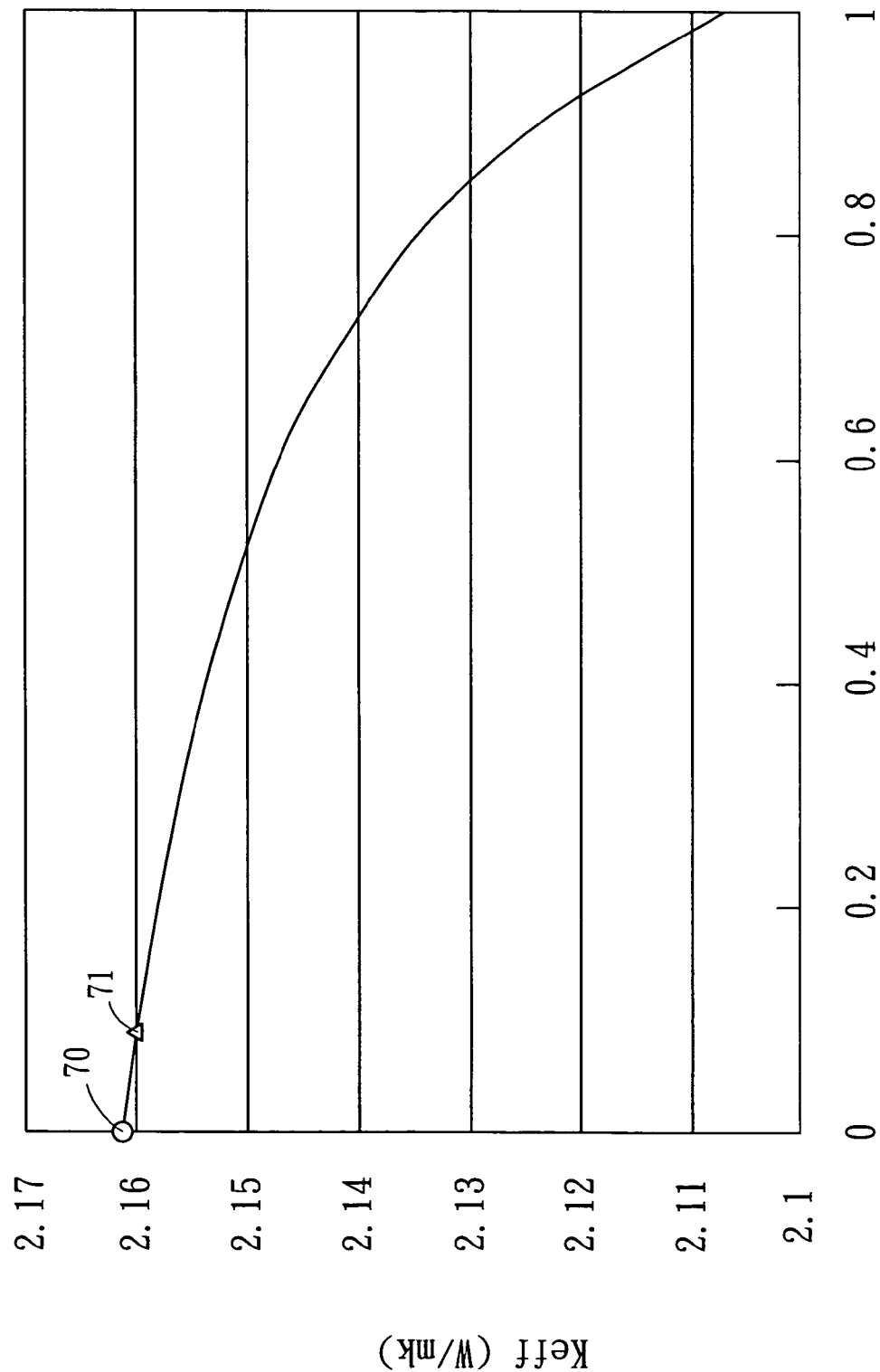
FIG. 7 is the curve of the thickness of the nickel coating versus the heat conduction value of the capillary structure layer.

Since a layer of material is coated onto the surface of the capillary structure layer 21 of the heat dissipating device according to the present invention, the embodiment adopting nickel as the material for the hydrophilic layer 24 and copper as the material for the heat dissipating device will lower the heat conduction value after a layer of nickel is coated onto the surface of the capillary structure layer 21, since the heat conduction value of the copper capillary structure layer 21 is better than nickel. However, since the thickness of the coating according to the invention is only several nanometers or micrometers, therefore the influence is insignificant. Please refer to FIG. 7 for the curve of the thickness of the nickel coating versus the heat conduction value of the capillary structure layer 21. The heat conduction value of the capillary structure layer 21 at the point 70 as shown in the figure is higher if the nickel layer is not coated. After a nickel coating of only several micrometers is coated, the heat conduction value of the capillary structure layer 21 at the point 71 as shown in the figure is decreased slightly, which only constitutes an influence of about 2.54%.

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for enhancing mobility of working fluid in liquid/gas phase heat dissipating device, being applied to a liquid/gas phase heat dissipating device with a sealed metal cavity containing a capillary structure layer and a working fluid, comprising:

forming a hydrophilic layer on said capillary structure layer of said liquid/gas heat dissipating device, said layer being a material for reducing a contact angle between said working fluid and a surface of said capillary structure layer to provide a good coupling force for said working fluid and said capillary structure layer and for enhancing the mobility of said working fluid on the surface of said capillary structure layer.

2. The method for enhancing mobility of working fluid in liquid/gas phase heat dissipating device of claim 1, wherein said hydrophilic layer is coated on the surface of said capillary structure layer.

3. The method for enhancing mobility of working fluid in liquid/gas phase heat dissipating device of claim 1, wherein said hydrophilic layer is formed by a sputtering method to deposit said material onto the surface of said capillary structure layer.

4. The method for enhancing mobility of working fluid in liquid/gas phase heat dissipating device of claim 1, wherein said hydrophilic layer is formed by a plating method to deposit said material onto the surface of said capillary structure layer.

5. The method for enhancing mobility of working fluid in liquid/gas phase heat dissipating device of claim 1, wherein said hydrophilic layer is formed by an electroplating method to deposit said material onto the surface of said capillary structure layer.

6. The method for enhancing mobility of working fluid in liquid/gas phase heat dissipating device of claim 1, wherein said hydrophilic layer is formed by an electroform method to deposit said material onto the surface of said capillary structure layer.

7. The method for enhancing mobility of working fluid in liquid/gas phase heat dissipating device of claim 1, wherein said hydrophilic layer is formed by a chemical vapor deposition (CVD) method to deposit said material onto the surface of said capillary structure layer.

8. The method for enhancing mobility of working fluid in liquid/gas phase heat dissipating device of claim 1, wherein said hydrophilic layer has a thickness from 5 nanometers to 10 micrometers.

9. The method for enhancing mobility of working fluid in liquid/gas phase heat dissipating device of claim 1, wherein said hydrophilic layer is made of the material selected from the collection of iron, zinc, aluminum, nickel and chromium.

* * * * *